United States Patent
Redpath

(10) Patent No.: US 10,224,907 B2
(45) Date of Patent: Mar. 5, 2019

(54) CONTROL OF GENERATOR EXERCISER TIMERS

(71) Applicant: Gary D. Redpath, Northfield Center, OH (US)

(72) Inventor: Gary D. Redpath, Northfield Center, OH (US)

(*) Notice: Subject to any disclaimer, the term of this patent is extended or adjusted under 35 U.S.C. 154(b) by 0 days.

(21) Appl. No.: 15/600,605

(22) Filed: May 19, 2017

(65) Prior Publication Data
US 2017/0338805 A1    Nov. 23, 2017

Related U.S. Application Data

(60) Provisional application No. 62/339,324, filed on May 20, 2016.

(51) Int. Cl.
*H03K 3/78* (2006.01)

(52) U.S. Cl.
CPC ..... *H03K 3/78* (2013.01); *H03K 2217/94052* (2013.01)

(58) Field of Classification Search
CPC .................................................. H03K 3/78
USPC ...................................................... 377/119
See application file for complete search history.

(56) References Cited

U.S. PATENT DOCUMENTS

| | | |
|---|---|---|
| 4,423,336 A | 12/1983 | Iverson et al. |
| 4,517,474 A * | 5/1985 | Shepter .............. H03K 19/173 326/40 |
| 6,172,432 B1 | 1/2001 | Schnackenberg et al. |
| 6,876,103 B2 | 4/2005 | Radusewicz et al. |
| 7,230,345 B2 | 6/2007 | Winnie et al. |
| 7,889,089 B1 | 2/2011 | Bollin |
| 8,222,548 B2 | 7/2012 | Espeut, Jr. |

(Continued)

OTHER PUBLICATIONS

Mitchell, Colin, "Talking Electronics", Feb. 11, 2015, pp. 1-118, https://web.archive.org/web/20150211002400/http://www.talkingelectronics.com:80/projects/200TrCcts/101-200TrCcts.html#20, retrieved May 1, 2018.*

(Continued)

*Primary Examiner* — Thomas Skibinski
(74) *Attorney, Agent, or Firm* — Wayne D. Porter, Jr.

(57) ABSTRACT

A control module for a generator exercise timer enables a user to conduct generator exercise sessions at intervals longer than predetermined intervals permitted by the manufacturer. The control module can be connected in series with a generator's existing electronic exerciser timer, preferably by disconnecting the existing exerciser timer's wiring harness from the exercise timer and connecting the control module to the exercise timer. The control module can be provided with a connector of its own to which the wiring harness can be connected. The control module includes a latching relay and a non-latching relay that can be operated in such a manner that alternating "engine start" signals are sent to the generator. Thus, the exercise timer will be effective to exercise the generator at delayed intervals, e.g., every other week rather than every week. The control module includes a pushbutton switch and a visible LED. The switch enables a user to control the state of the latching relay, while the LED indicates to the user whether the latching relay will permit or prevent the next engine start signal from being effective to start the generator.

14 Claims, 5 Drawing Sheets

(56) References Cited

U.S. PATENT DOCUMENTS

| | | |
|---|---|---|
| 8,766,489 B2 | 7/2014 | Lathrop |
| 2012/0053884 A1 | 3/2012 | Batzler et al. |
| 2013/0158726 A1 | 6/2013 | Mauk |
| 2013/0285623 A1 | 10/2013 | Greenwald et al. |
| 2014/0239740 A1 | 8/2014 | Stellwag |
| 2015/0326159 A1 | 11/2015 | White et al. |

OTHER PUBLICATIONS

"Relay Circuit Design", Aug. 1, 2013, pp. 1-7, https://web.archive.org/web/20130801015739/http://relaysbc.sourceforge.net/circuits.html, retrieved May 1, 2018.*

* cited by examiner

CONTROL OF GENERATOR EXERCISER TIMERS

PRIORITY CLAIM

The present application claims priority from, and incorporates by reference herein for all purposes, provisional application Ser. No. 62/339,324, filed May 20, 2016 by Gary D. Redpath.

BACKGROUND OF THE INVENTION

1. Field of the Invention

The invention relates generally to generator exercise timers and, more specifically, to the control of generator exerciser timers in such a manner that the interval between generator exercise sessions is extended.

2. Description of the Prior Art

Electrical generators, particularly for commercial applications, customarily are provided with the capability to be "exercised" for short periods of time at predetermined intervals. The purpose of conducting an exercise session is to keep the generator ready for use in the event of an electrical outage. In the absence of conducting exercise sessions, it is possible that the generator will fail to operate under emergency conditions due to problems that arise from inactivity, such as a discharged battery. Also, by conducting exercise sessions at regular intervals, engine damage such as oil seal drying can be prevented.

Generators that have the capability to be exercised typically have a programmable control, or timer, that enables the user to select when exercise sessions will occur. The available selections are predetermined by the manufacturer. A typical interval is once per week or once per month. The user can select the day and time that the session will occur, e.g., every Saturday at 8:00 a.m or every fourth Sunday at 9:00 a.m., etc. An example of a bi-weekly exercise interval can be found in the "Evolution Controls" of the Guardian Series of generator sold by Generac Power Systems, Inc., S45W29290 Wisconsin 59, Waukesha, Wis. 53189 (hereinafter "GENERAC"). See http://gens.lccdn.com/generaccorporate/media/library/content/all-products/generators/home-generators/guardian-series/16 kw-7035/generac-home-generators-guardian-16 kw-20 kw-22 kw_spec-sheet-2017.pdf.

In addition to the Guardian Series, GENERAC sells a wide variety of commercial and residential generators, many of which are provided with programmable exerciser timers. One such timer is known by the model designation MK III. The MK III timer permits the generator to be exercised at weekly intervals, but not at any other intervals. This is a drawback since some users believe that weekly exercise sessions are too frequent and result in wasted fuel. These users believe that less frequent exercising, such as at bi-weekly intervals, is adequate to ensure reliability of the generating system while reducing the amount of fuel consumption occasioned by conducting exercise sessions.

Desirably, a device would be available that would enable a user to conduct generator exercise sessions at intervals different than the predetermined intervals permitted by the manufacturer. Preferably, any such device would be available as an inexpensive add-on control module that could be quickly and easily connected to existing exercise timers.

SUMMARY OF THE INVENTION

The present invention provides a new and improved generator exercise timer that enables a user to conduct generator exercise sessions at intervals different than the predetermined intervals permitted by the manufacturer. The invention preferably will be sold as an aftermarket add-on product to modify existing exercise timers, although its circuitry could be included as part of originally supplied equipment, if desired. The present invention is usable with many types or brands of generators and exercise timers, and is not limited to generators or exercise timers of a particular manufacturer.

In a preferred embodiment, the invention comprises a control module that can be connected to a generator's existing electronic exerciser timer. The connection can be made by disconnecting the existing exerciser timer's wiring harness from a connector included as part of the timer and plugging the control module into the exposed timer connector. The control module can be provided with a connector of its own to receive the wiring harness. Thus, the control module according to the invention can be quickly and conveniently connected in series with the existing generator wiring.

A typical generator with which the invention can be used is a GENERAC industrial power system having a GTS 100-400 transfer switch. This generator employs a MK III electronic timer that is limited to exercise sessions spaced a maximum of one week apart. The control module according to the invention can be connected to the MK III timer in the manner indicated, namely, by disconnecting the existing wiring harness, plugging the control module into the exposed connector, and connecting the wiring harness to the control module connector (either before or after the control module is plugged into the timer's connector).

The control module includes a latching relay that can be cycled between two stable states, namely, "set" and "reset." The latching relay controls a non-latching relay, which in turn controls whether an "engine start" signal is sent to the generator. By cycling the latching relay between the set and reset state whenever an engine start signal is received from the exercise timer, the non-latching relay will permit every other engine start signal to be sent to the generator. Thus, the exercise timer will be effective to exercise the generator at delayed intervals, e.g., every other week rather than every week. The control module includes a pushbutton switch and a visible indicator, preferably in the form of a light-emitting diode (LED). The switch enables a user to control the state of the latching relay, while the LED indicates to the user whether the latching relay will permit or prevent the next engine start signal from being effective to start the generator.

The invention provides an inexpensive, reliable technique to enable generators to be exercised at longer intervals than permitted by existing electronic timers. The invention can be provided in the form of a compact aftermarket control module that can be quickly and easily plugged into the wiring of existing generators, or its circuitry can be incorporated into new construction, if desired.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DESCRIPTION OF THE PREFERRED EMBODIMENT

Figure 1:
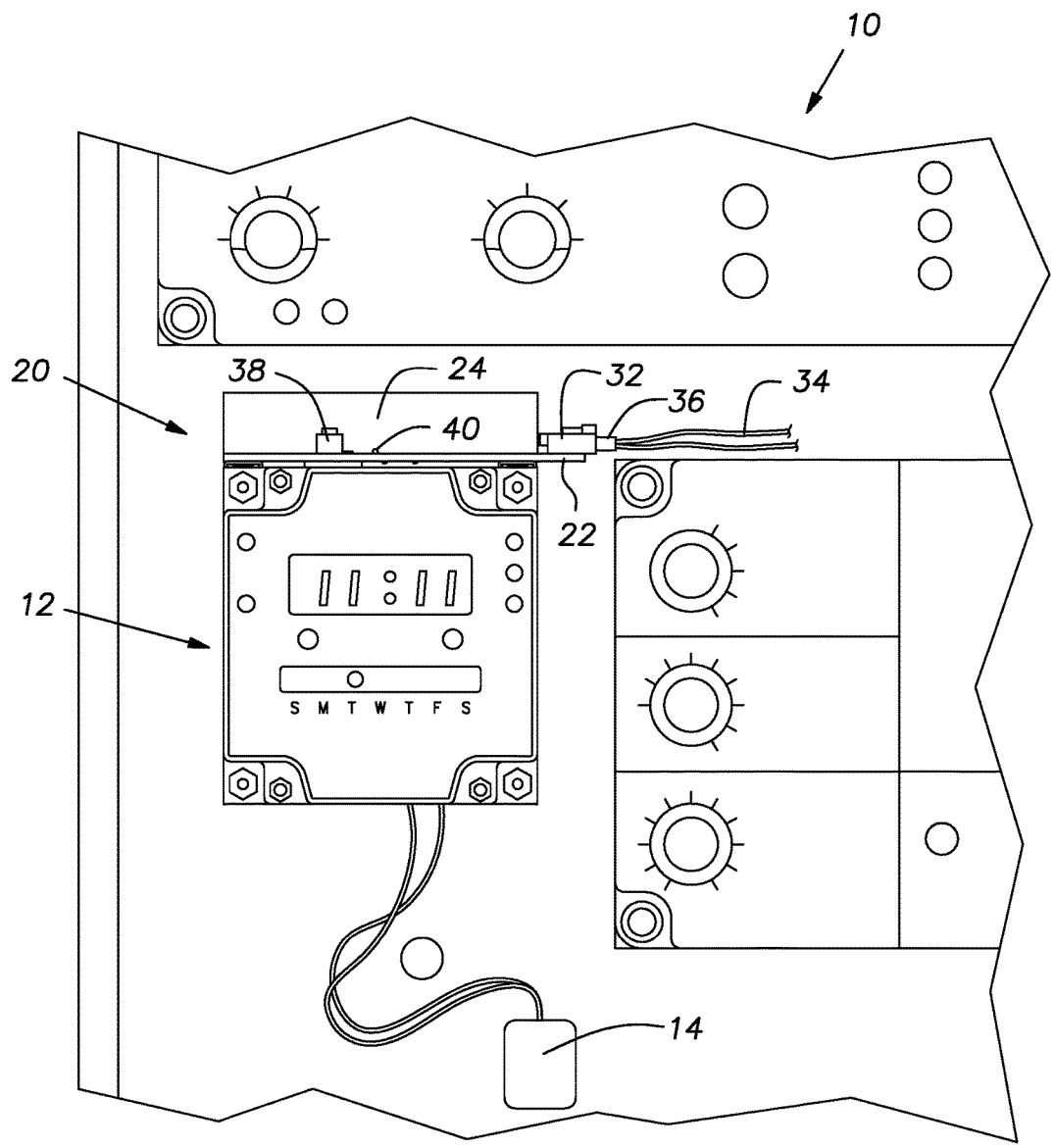
FIG. 1 is a front elevational view of a prior art generator exerciser timer installed in a control cabinet with a control module according to the invention connected to the exerciser timer with a wiring harness connected to the control module.
Figure 2:
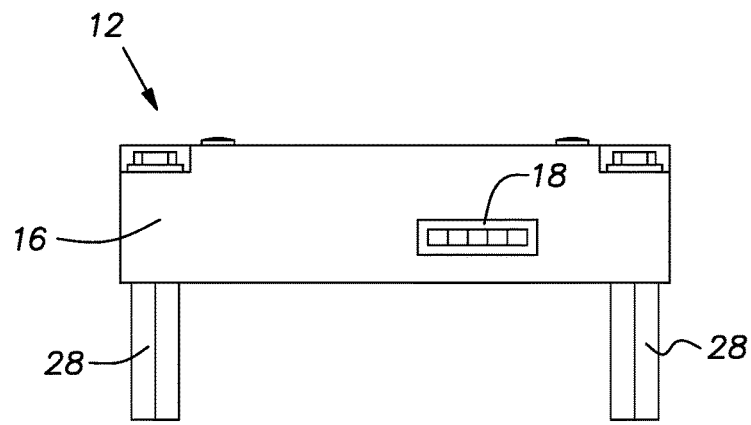
FIG. 2 is a top plan view of the generator exerciser timer of FIG. 1.
Figure 3:
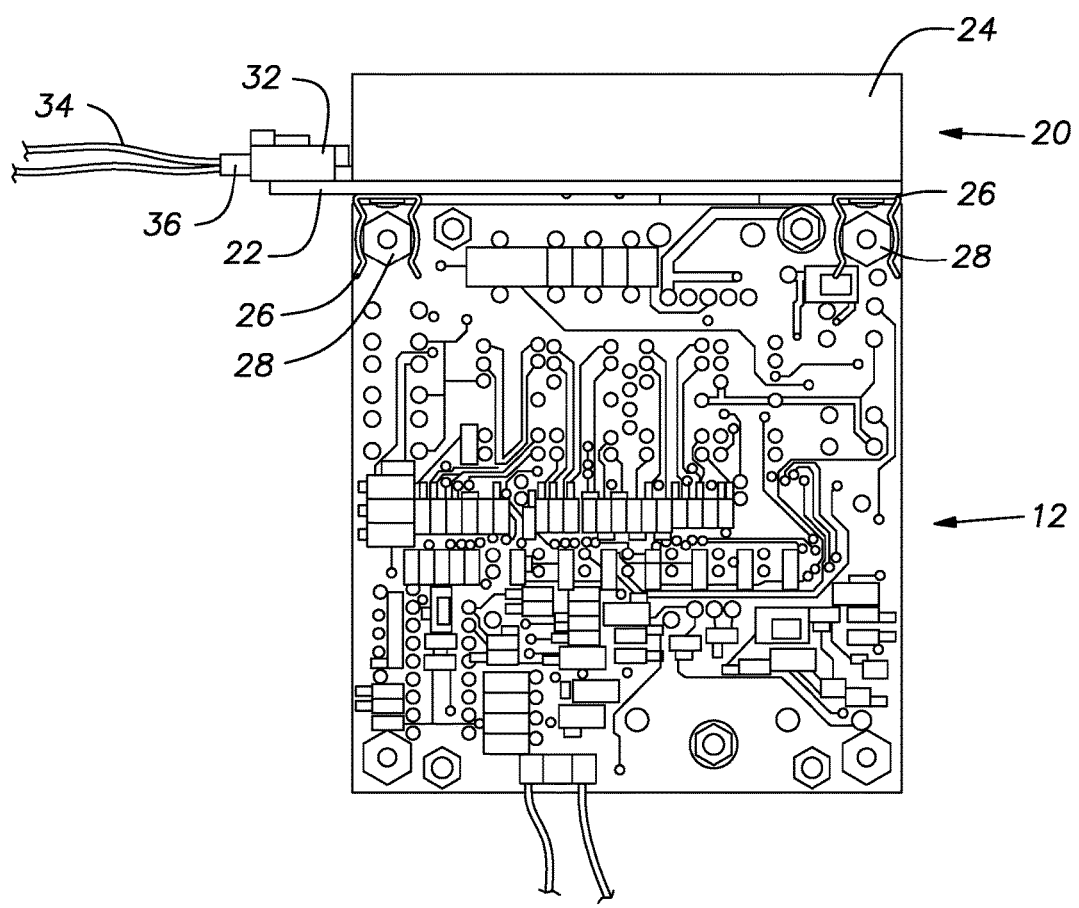
FIG. 3 is a rear elevational view of the generator exerciser timer, control module, and wiring harness of FIG. 1.
Figure 4:
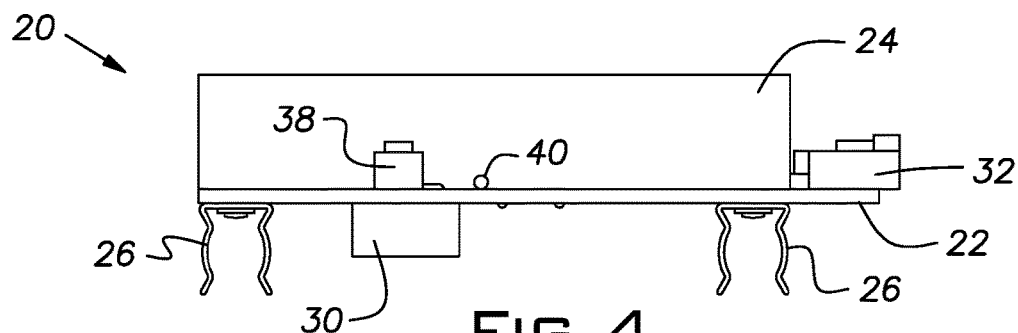
FIG. 4 is a front elevational view of a control module according to the invention.
Figure 5:
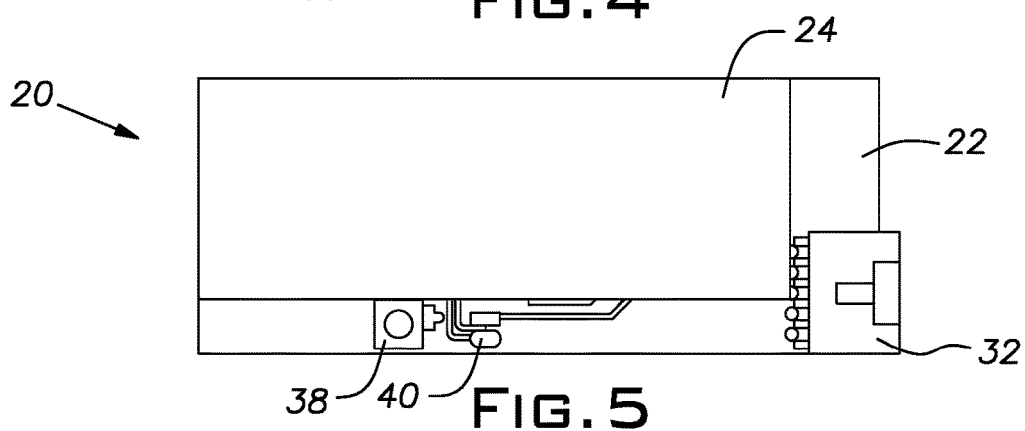
FIG. 5 is a top plan view of the control module of FIG. 4.
Figure 6:
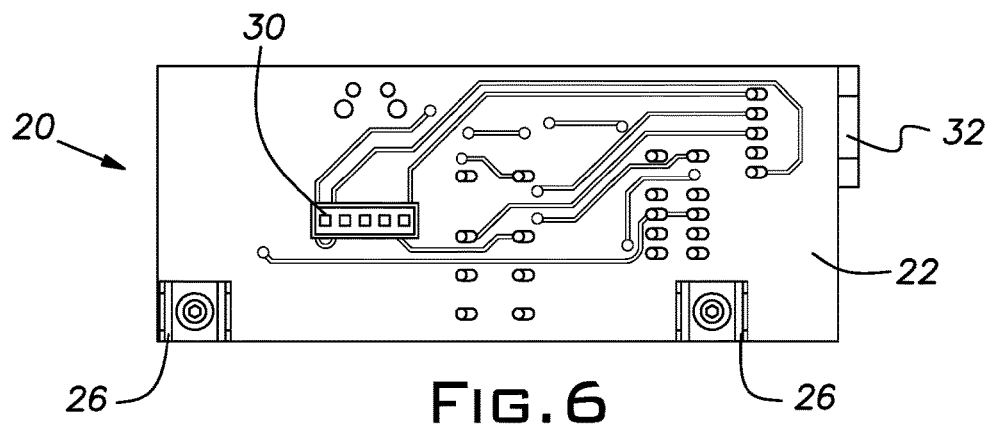
FIG. 6 is a bottom plan view of the control module of FIG. 4.
Figure 7:
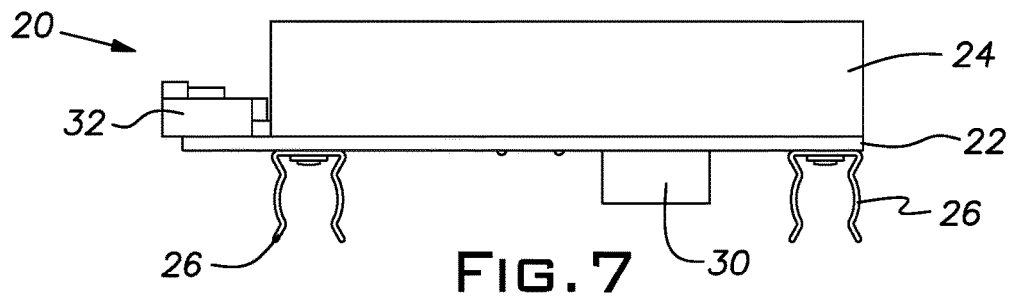
FIG. 7 is a rear elevational view of the control module of FIG. 4.

Referring to FIG. 1, a control panel for an electrical generator is indicated by the reference numeral 10. The control panel 10 includes a variety of components for controlling operation of the generator, including an electronic exercise timer 12 (FIGS. 1-3). The exerciser timer 12 has an auxiliary power supply 14 that prevents loss of memory in the event that the main source of power to the exercise timer 12 should be lost or interrupted. The exerciser timer 12 has a top wall 16 that includes a multi-pin connector 18.

The generator in question is a GENERAC industrial power system having a GTS 100-400 transfer switch. The exercise timer 12 is a GENERAC MK III electronic exercise timer that permits engine operation at weekly intervals. The present invention can be used with other generators, transfer switches and exercise timers by GENERAC and other manufacturers as will be apparent from the following description. A more complete description of the generator, transfer switch and exercise timer in question, as well as other GENERAC generators, transfer switches and exercise timers, can be found on the internet at www.generac.com, and all such descriptions are incorporated herein by reference.

An example of a typical GENERAC generator having a weekly exercise timer is the air-cooled automatic standby generator sold under Model Nos. 04673-2, 04674-2 and 04675-3. As noted in the product's installation and owner's manual, which is incorporated herein by reference: "The generator is equipped with an exercise timer. Once it is set, the generator will start and exercise once every seven days, on the day of the week and at the time of day the following sequence is completed. During this exercise period, the unit runs for approximately 12 minutes and then shuts down."

Referring also to FIGS. 3-7, a control module according to the invention is indicated by the reference numeral 20. The control module 20 includes a circuit board 22, a cover 25, and a pair of spaced mounting clips 26 that project from the underside of the circuit board 22. The mounting clips 26 are adapted to engage spacers 28. The spacers 28, in turn, are employed to mount the exercise timer 12 in the control panel 10 and space it a short distance from the back wall of the control panel 10.

A multi-pin connector 30 extends from the underside of the circuit board 22 for connection to the multi-pin connector 18 included as part of the top wall 16 of the exercise timer 12. A multi-pin connector 32 projects from one side of the circuit board 22. A wiring harness 34 included as part of the control circuitry for the generator has a multi-pin connector 36 that can be connected to the multi-pin connector 32. The control module 20 includes a switch 38 and a visual indicator in the form of LED 40 mounted on an exposed portion of the circuit board 22.

Figure 8:
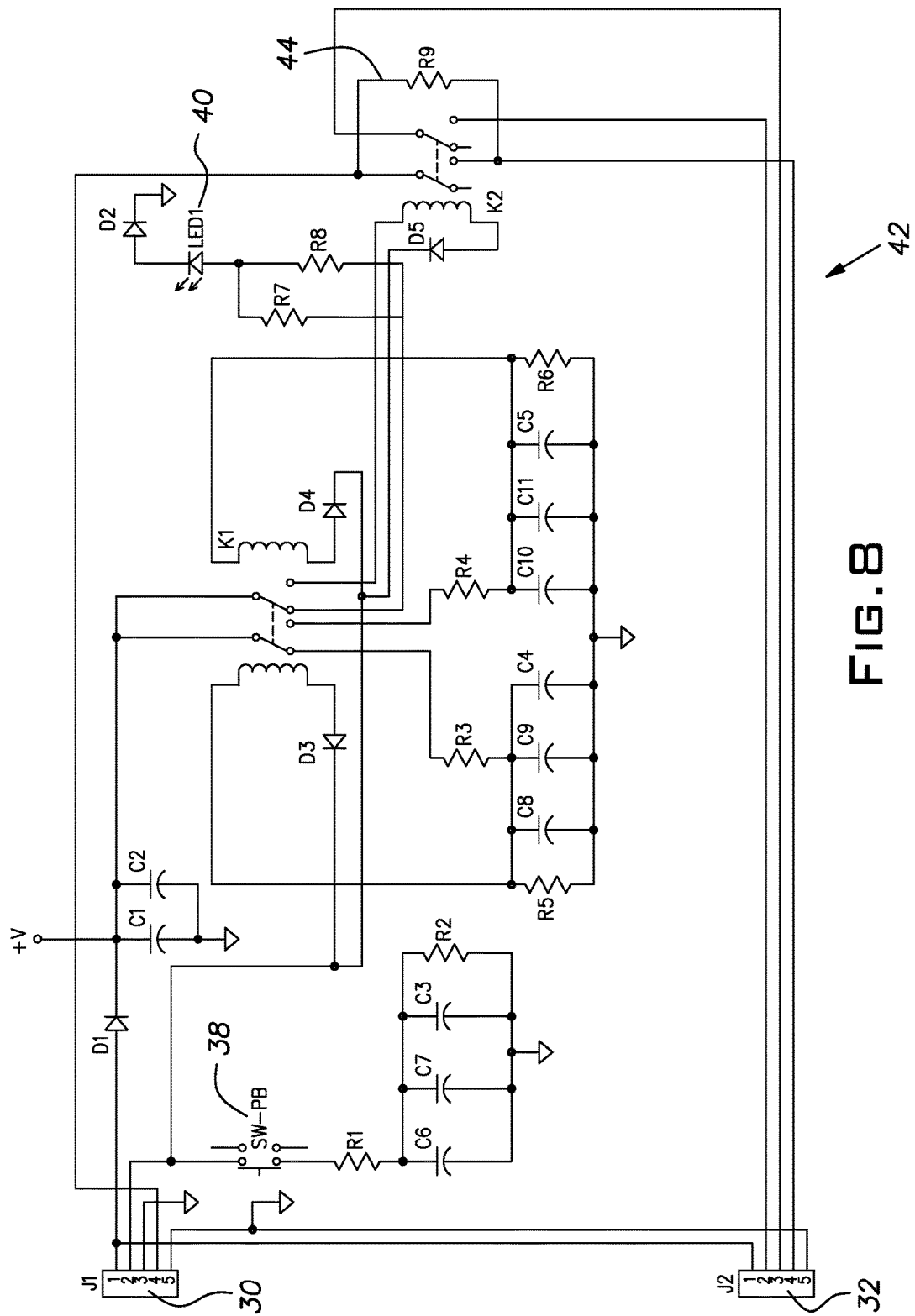
FIG. 8 is a circuit diagram of the control module according to the invention.

Referring now to FIG. 8, a circuit diagram of a control module according to the invention is indicated by the reference numeral 42. Multi-pin connector 30 is identified by the reference notation J1, while multi-pin connector 32 is identified by the reference notation J2. Switch 38 is identified by the reference notation SW-PB and the LED 40 is identified by the reference notation LED1.

The invention circuitry includes a V23079 two-coil, double pole, double throw DC latching relay indentified by the reference notation K1 and a DS2Y double pole, double throw DC non-latching relay identified by the reference notation K2. If desired, a 12 volt DC G6SK-2 double pole, double throw relay can serve as relay K1. Other components include capacitors indicated by C1, C2, etc., resistors R1, R2, etc., and diodes D1, D2, etc. The diodes serve as solid state rectifiers. All of the circuitry components are conventional and are available commercially from a number of manufacturers.

Values/models of the foregoing components are set forth in the following table. Some of the values are stated to be "No pop," which means "not populated." This means that the circuit board 22 has the capability to receive the components in question if necessary or desired, but the components presently are not being used.

| Component | Value/Model |
| --- | --- |
| J1 | SSW-105-01-G-S |
| J2 | 705530004 |
| C1 | No pop |
| C2 | 47 µF |
| C3 | 47 µF |
| C4 | No pop |
| C5 | No pop |
| C6 | No pop |
| C7 | 10 µF |
| C8 | No pop |
| C9 | 10 µF |
| C10 | No pop |
| C11 | 10 µF |
| D1 | S1G |
| D2 | S1G |
| D3 | S1G |
| D4 | S1G |
| D5 | S1G |
| K1 | V23079 or G6SK-2 |
| K2 | DS2Y single side stable |
| R1 | 10 Ω |
| R2 | 21k Ω |
| R3 | 10k Ω |
| R4 | 10k Ω |
| R5 | 1M Ω |
| R6 | 1M Ω |
| R7 | 2k Ω |
| R8 | No pop |
| R9 | No pop |

The control module 20 can be connected to the exerciser timer 12 in the manner indicated, namely, by disconnecting the existing wiring harness 34, plugging the multi-pin connector 30 into the exposed multi-pin connector 18 of the exerciser timer 12, and connecting the multi-pin connector 36 of the wiring harness 34 to the control module multi-pin connector 32. The latter action can occur either before or after the control module multi-pin connector 30 is plugged into the timer's multi-pin connector 18.

In operation, rectifier D1 and capacitor C2 generate a DC voltage from an AC input on J1 pins 1 and 5. The AC input is on the order of 17 VAC to 28 VAC. The resultant DC voltage charges capacitor C8 through resistor R3. Connector pins J1-2 and J1-3 receive an "engine start" signal from the exercise timer 12 at periodic intervals, presumably one week apart. Pin J1-4 similarly receives a signal from the exercise timer 12 that is used to control an in-phase monitor in the generator's transfer switch. As illustrated, pin J1-4 is connected to pin J2-4 by a jumper 44 that bypasses relay K2.

Relay K1 is a latching relay that exhibits two stable states: "reset" and "set" or "on." The reset state is shown in FIG. 8. In this state, relay pins connected to resistor R3 are shorted, while the two other relay pins are open. This state is preserved even in the absence of applied power.

When a contact closure occurs on J1-2 and J1-3 (i.e., when an "engine start" signal is received from exercise timer 12) or switch 38 is pressed, relay K1 will shift to the set state and will remain in that state in the absence of applied power. In the set state, K1 relay pins are connected to resistor R4 and resistor R7. Capacitor C11 begins to charge through resistor R4, with a charge time of approximately ½ of a second. Power also is applied to relay K2 when relay K1 is in the set state.

As illustrated in FIG. 8, K2 relay pins are in a normally open state, although connector pins J1-4 and J2-4 are connected by the jumper 44 as described earlier. When relay K2 is energized upon receiving power from relay K1, K2 relay pins are shifted, which allows connector pins J2-2 and J2-3 to mirror the contact closure on connector pins J1-2 and J1-3. A signal received from pin J1-4 also is presented to connector pin J2-4.

In the illustrated embodiment, the connection of pins J2-2 and J2-3 is controlled by relay K2, while the connection of pins J1-4 and J2-4 is maintained under all conditions. It also is possible to provide a make or break connection for pins J1-4 and J2-4. That could be accomplished by cutting the jumper 44 or by providing a resistor R9 having a resistance adequate to prevent unswitched signals. If one of these options is chosen, the connection between pins J1-4 and J2-4 will be made when relay K2 is in the switched state and broken when relay K2 is in the unswitched state.

As will be apparent from the foregoing description, successive start signals from exercise timer 12 will cause relay K1 to cycle between set and reset states. When relay K1 is in the set state, relay K2 will be actuated, which will permit an engine start signal to be sent to the generator engine. When relay K1 is in the reset state, relay K2 will not be actuated, which will prevent an engine start signal from being sent to the generator engine.

LED 40 reflects the state of the relay K1 such that when illuminated the next cycle will permit the generator engine to run. Switch 38 is used to toggle the state of relay K1. Capacitor C6 and resistor R2 permit switch 38 to act as a momentary switch, thus not turning on the generator engine when switch 38 is pressed. Resistor R1 serves to protect the contacts of switch 38 from a momentary high current when discharging resistor R2. Resistors R5 and R6 serve to bleed off any leakage from rectifiers D3 and D4, respectively.

The net result of using the control module 20 is that every other generator engine "start" signal received from the exerciser timer 12 will be effective to start the generator engine. Therefore, when the control module 20 is installed and operational, the typical once-per-week exercise sessions permitted by the exerciser timer 12 will occur only every other week. This will result in a savings of 50% of fuel costs while enabling the generator engine to be exercised on a schedule adequate to protect its oil seals and otherwise ensure its functionality.

An Alternative Embodiment

Figure 9:
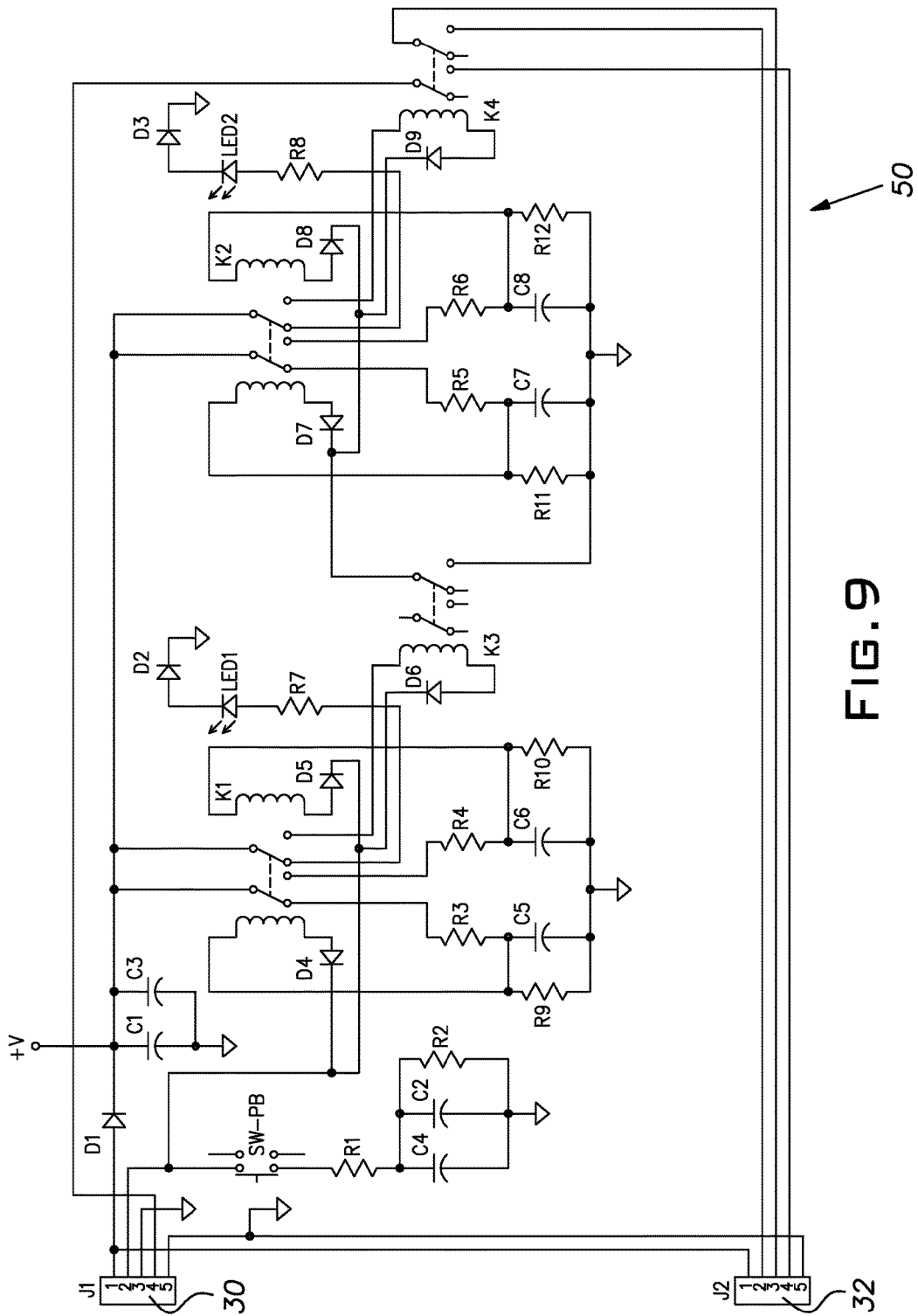
FIG. 9 is a circuit diagram of an alternative embodiment of a control module according to the invention.

Referring now to FIG. 9, a circuit diagram of an alternative embodiment of the invention is indicated by the reference numeral 50. The circuitry 50 employs many of the same components as the circuitry 42 and like reference numerals or designations will be used where appropriate.

As will be apparent from a comparison of FIGS. 8 and 9, the circuitry 50 is a substantially "doubled up" version of the circuitry 42. In a manner similar to the first-described embodiment, a latching relay K1 controls operation of a non-latching relay K3. A second latching relay K2 controls operation of a non-latching relay K4. Relay K3 controls operation of relay K2, while relay K4 provides a switchable connection of pins J2-2 and J2-3. Switch SW-PB controls the state of latching relay K1. Visual indicators (LEDs) LED1 and LED2 show the operational state of latching relays K1 and K3, respectively.

In operation, as with the first-described embodiment, an engine start signal will cycle relay K1 between set and reset states. In turn, relay K3 will be cycled between open and closed states. In the contact-closed position of relay K3, a signal will be sent to relay K2. Successive signals sent to relay K2 will result in alternating open and closed states for relay K4.

Every other engine start signal will result in a signal being sent to relay K2, and every other signal sent by relay K3 to relay K2 will result in a contact-closed state for relay K4. This means that the generator engine will be started after every fourth engine start signal from the exercise timer 12. Since the engine start signals are sent by engine timer 12 on a weekly basis, use of the embodiment 50 will result in the generator engine being started every four weeks.

Circuitry similar to circuitry 42 can be added to embodiment 50 to make it possible to provide increasingly greater delay periods, if desired. If additional latching and non-latching relays are added, the delay period can be increased to six weeks, eight weeks, and so forth. While it is unlikely that such increased exercise periods would be employed, they remain an option for generator users.

Although the present invention has been described in detail with reference to a particular example and embodiment, the example and embodiment described herein is merely illustrative. Variations and modifications of the present invention will occur readily to those skilled in the art. It is intended that all such variations, modifications and equivalents thereof be encompassed within the scope of the following claims.

What is claimed is:

1. Circuitry to control operation of an exercise timer of an electric generator powered by a generator engine, the exercise timer causing the generator engine to be started at predetermined intervals in response to periodic "engine start" signals, comprising:

a first latching relay adapted to receive an engine start signal from the exercise timer, the first latching relay being operable between stable set and reset states, the first latching relay switching between the set and reset states or the reset and set states each time an engine start signal is received from the exercise timer; and a first non-latching relay in electrical communication with the first latching relay, the first non-latching relay having a first pair of contacts that are normally open when the first latching relay is in the reset state and a second pair of contacts that are closed when the first latching relay is in the set state, the second pair of contacts, when closed, permitting an engine start signal to be sent to the generator engine;

whereby, engine start signals are sent to the generator engine at intervals twice as long as the predetermined intervals established by the exercise timer.

2. The circuitry of claim 1, further comprising a control module, the latching relay and the non-latching relay being included as part of the control module, the control module being connectable in series between the exercise timer and the generator engine.

3. The circuitry of claim 2, wherein:
the generator engine includes a wiring harness that includes a first connector;
the exercise timer includes a second connector, the second connector adapted to receive the first connector of the wiring harness; and
the control module includes third and fourth connectors, the third connector adapted to be connected to the first connector and the fourth connector adapted to be connected to the second connector, whereby the control module is connected in series with the exercise timer and the wiring harness.

4. The circuitry of claim 1, further comprising:
a switch connected to the first latching relay, the switch permitting the first latching relay to be cycled between the set and reset states or the reset and set states; and
a visual indicator that is activated when the first latching relay is in the set state.

5. The circuitry of claim 1, further comprising:
a second latching relay adapted to receive a signal from the first non-latching relay, the second latching relay being operable between stable set and reset states, the second latching relay switching between the set and reset states or the reset and set states each time a signal is received from the first non-latching relay; and
a second non-latching relay in electrical communication with the second latching relay, the second non-latching relay having a first pair of contacts that are normally open when the second latching relay is in the reset state and a second pair of contacts that are closed when the second latching relay is in the set state, the second pair of contacts of the second non-latching relay, when closed, permitting an engine start signal to be sent to the generator engine;
whereby, engine start signals are sent to the generator engine at intervals four times as long as the predetermined intervals established by the exercise timer.

6. The circuitry of claim 5, further comprising:
a switch connected to the first latching relay, the switch permitting the first latching relay to be cycled between the set and reset states or the reset and set states;
a first visual indicator that is activated when the first latching relay is in the set state; and
a second visual indicator that is activated when the second latching relay is in the set state.

7. Electrical generation apparatus, comprising:
an electrical generator having an engine and a transfer switch;
a controller included as part of the transfer switch, the controller adapted to sense a decrease in electrical power from an electrical source and to start the engine in order to provide supplemental electrical power while the electrical power from the electrical source remains below a predetermined level and to stop the engine when electrical power from the electrical source rises above a predetermined level;
an exercise timer included as part of the controller, the exercise timer adapted to send "engine start" electrical signals at first, predetermined, periodic intervals in order to cause the engine to start at said first, predetermined, periodic intervals; and
a control module connected in series with the exercise timer, the control module causing engine start electrical signals from the exercise timer to be sent only at second, predetermined, periodic intervals.

8. The electrical generation apparatus of claim 7, wherein the second, predetermined intervals are longer than the first, predetermined intervals.

9. The electrical generation apparatus of claim 8, wherein the second, predetermined intervals are two weeks and the first, predetermined intervals are one week.

10. The electrical generation apparatus of claim 7, wherein:
the controller includes a wiring harness that includes a first connector;
the exercise timer includes a second connector, the second connector adapted to receive the first connector of the wiring harness; and
the control module includes third and fourth connectors, the third connector adapted to be connected to the first connector and the fourth connector adapted to be connected to the second connector, whereby the control module is connected in series with the exercise timer and the wiring harness.

11. A method of controlling the operation of an exercise timer of an electric generator powered by a generator engine, the exercise timer causing the generator engine to be started at predetermined intervals by sending periodic "engine start" signals to the generator engine, comprising the steps of:
providing electrical circuitry to receive engine start signals from the exercise timer; and
sending alternate engine start signals from the electrical circuitry to the generator engine, whereby the predetermined intervals are doubled.

12. The method of claim 11, wherein the electrical circuitry includes a latching relay operable between stable set and reset states or reset and set states and a non-latching relay in electrical communication with the latching relay, further comprising the steps of:
switching the latching relay between the set and reset states or the reset and set states each time an engine start signal is received from the exercise timer;
providing the non-latching relay with a first pair of contacts that are normally open when the latching relay is in the reset state and a second pair of contacts that are closed when the latching relay is in the set state; and
sending an engine start signal to the generator engine when the second pair of contacts are closed.

13. The method of claim 11, wherein the step of providing electrical circuitry to receive engine start signals from the exercise timer includes the step of providing a control module, and further comprising the step of connecting the control module in series between the exercise timer and the generator engine.

14. The method of claim 13, wherein:
the generator engine includes a wiring harness that includes a first connector, the exercise timer includes a second connector, the second connector adapted to receive the first connector of the wiring harness, and the control module includes third and fourth connectors; and the step of connecting the control module in series between the exercise timer and the generator engine includes the steps of connecting the third connector to the first connector and connecting the fourth connector to the second connector.

\* \* \* \* \*